(12) United States Patent
Olsson

(10) Patent No.: US 12,027,989 B2
(45) Date of Patent: Jul. 2, 2024

(54) AC-DC CONVERTER CIRCUIT

(71) Applicant: Epinovatech AB, Lund (SE)

(72) Inventor: Martin Andreas Olsson, Lund (SE)

(73) Assignee: Epinovatech AB, Lund (SE)

(*) Notice: Subject to any disclaimer, the term of this patent is extended or adjusted under 35 U.S.C. 154(b) by 240 days.

(21) Appl. No.: 17/755,142

(22) PCT Filed: Oct. 22, 2020

(86) PCT No.: PCT/EP2020/079756
§ 371 (c)(1),
(2) Date: Apr. 21, 2022

(87) PCT Pub. No.: WO2021/078863
PCT Pub. Date: Apr. 29, 2021

(65) Prior Publication Data
US 2022/0399826 A1  Dec. 15, 2022

(30) Foreign Application Priority Data
Oct. 25, 2019  (EP) ..................................... 19205265

(51) Int. Cl.
*H02M 3/158* (2006.01)
*B60L 50/60* (2019.01)
(Continued)

(52) U.S. Cl.
CPC ............. *H02M 7/217* (2013.01); *B60L 50/60* (2019.02); *B60L 53/24* (2019.02); *H01L 29/778* (2013.01);
(Continued)

(58) Field of Classification Search
CPC ............... H01L 29/0847; H01L 29/402; H01L 29/41725; H01L 29/41775;
(Continued)

(56) References Cited

U.S. PATENT DOCUMENTS 7,250,359 B2  7/2007 Fitzgerald
9,379,204 B2  6/2016 Fogel et al.
(Continued)

FOREIGN PATENT DOCUMENTS

CN  103477418  12/2013
CN  106549050  3/2017
(Continued)

OTHER PUBLICATIONS

Alamo et al., III-V CMOS: the key to sub-10 nm electronics?, Microsystems Technology Laboratories, MIT, 2011 MRS Spring Meeting and Exhibition Symposium P: Interface Engineering for Post-CMOS Emerging Channel Materials.
(Continued)

*Primary Examiner* — Thienvu V Tran
*Assistant Examiner* — Shahzeb K Ahmad
(74) *Attorney, Agent, or Firm* — Knobbe, Martens, Olson & Bear, LLP

(57) ABSTRACT

There is provided an AC-DC converter circuit (100) for high power charging of an electrical battery. The circuit comprises an input rectifier comprising a first node and a second node. The input rectifier (110) is configured to receive an AC voltage at the first node (112) and provide a rectified voltage at the second node (114). The circuit further comprises a first transistor (120), comprising a first gate node (122), a first source node (124), and a first drain node (126). The first drain node is connected to the second node of the input rectifier. The first gate node is connected to a ground node (170). The circuit further comprises a second transistor (130), comprising a second gate node (132), a second source node (134), and a second drain node (136). The second drain node is connected to the first source node. The second transistor materially corresponds to the first transistor. The circuit further comprises a duty cycle control unit (140)

(Continued)

connected to the second gate node for providing the second transistor with a switching waveform. The circuit further comprises an output rectifier (150) connected to the second source node or the first source node. The circuit further comprises an output electronic filter (160) connected to the second source node or an output node (151) of the output rectifier. An AC-DC converter device, a method for charging an electrical battery, and a regenerative braking system is also provided.

13 Claims, 9 Drawing Sheets

(51) Int. Cl.
*B60L 53/24* (2019.01)
*H01L 29/778* (2006.01)
*H02J 7/02* (2016.01)
*H02M 1/00* (2006.01)
*H02M 7/06* (2006.01)
*H02M 7/21* (2006.01)
*H02M 7/217* (2006.01)
*H03K 17/10* (2006.01)
*H03K 17/16* (2006.01)

(52) U.S. Cl.
CPC ............ *H02J 7/02* (2013.01); *H02M 1/0048* (2021.05); *H02M 3/158* (2013.01); *H02M 7/06* (2013.01); *H02M 7/21* (2013.01); *H03K 17/102* (2013.01); *H03K 17/163* (2013.01); *B60L 2210/30* (2013.01); *B60L 2210/40* (2013.01); *H01M 2220/20* (2013.01); *H01M 2220/30* (2013.01); *H02M 1/0045* (2021.05); *H02M 1/007* (2021.05)

(58) Field of Classification Search
CPC ............ H01L 29/42316; H01L 29/772; H01L 29/2003; H01L 29/41766; H01L 29/778; H01L 29/205; H01L 29/7789; H01L 29/7787; H01L 29/872; H01L 27/0605; H01L 27/0629; H01L 21/8258; H01L 2224/0603; H01L 2924/13091; H03K 17/102; H03K 17/163; H03K 17/04106; H03K 17/08122; H03K 17/687; H02M 7/02; H02M 7/06; H02M 7/155; H02M 7/21; H02M 7/217; H02M 1/0045; H02M 1/0048; H02M 1/007; H02M 3/158; H02M 3/156; B60L 50/60; B60L 53/24; B60L 2210/30; B60L 2210/40; B60L 2200/91; H01M 2220/20; H01M 2220/30; H02J 7/02
See application file for complete search history.

(56) References Cited

U.S. PATENT DOCUMENTS

| | | |
|---|---|---|
| 2003/0165418 A1 | 9/2003 | Ajayan |
| 2006/0134883 A1 | 6/2006 | Hantschel |
| 2006/0189018 A1 | 8/2006 | Yi |
| 2007/0108435 A1 | 5/2007 | Harmon |
| 2007/0215899 A1 | 9/2007 | Thomas |
| 2008/0122418 A1 | 5/2008 | Biere et al. |
| 2008/0153000 A1 | 6/2008 | Salot |
| 2008/0171424 A1 | 7/2008 | Li |
| 2009/0269909 A1 | 10/2009 | Kim |
| 2010/0259186 A1* | 10/2010 | Ernoux ............... H02M 3/155 315/294 |
| 2010/0276664 A1 | 11/2010 | Hersee |
| 2011/0020704 A1 | 1/2011 | Fukuchi |
| 2011/0140072 A1 | 6/2011 | Varangis |
| 2012/0001153 A1 | 1/2012 | Hersee |
| 2012/0235117 A1 | 9/2012 | Takashi et al. |
| 2013/0187627 A1 | 7/2013 | Imada et al. |
| 2014/0008609 A1 | 1/2014 | Chiu |
| 2014/0078781 A1* | 3/2014 | Imada ............... H01L 29/7787 323/311 |
| 2014/0134773 A1* | 5/2014 | Jain ............... H01L 29/2003 438/44 |
| 2014/0197130 A1 | 7/2014 | Lemke |
| 2014/0239346 A1* | 8/2014 | Green ............... H01L 29/7787 257/192 |
| 2015/0076450 A1 | 3/2015 | Weman |
| 2015/0084685 A1* | 3/2015 | Hirose ............... H03K 17/302 327/382 |
| 2015/0118572 A1 | 4/2015 | Lund et al. |
| 2015/0155275 A1* | 6/2015 | Bahramian ......... H01L 29/2003 257/76 |
| 2015/0263100 A1* | 9/2015 | Deboy ............ H01L 29/42316 327/537 |
| 2015/0311072 A1 | 10/2015 | Aagesen |
| 2016/0172305 A1 | 6/2016 | Sato |
| 2017/0062213 A1 | 3/2017 | Patolsky |
| 2017/0110332 A1 | 4/2017 | Beveridge |
| 2017/0257025 A1* | 9/2017 | Meiser ............... H01L 29/404 |
| 2017/0323788 A1 | 11/2017 | Mi |
| 2021/0265632 A1 | 8/2021 | Olsson |
| 2021/0327712 A1 | 10/2021 | Olsson |

FOREIGN PATENT DOCUMENTS

| | | |
|---|---|---|
| CN | 110336028 | 3/2021 |
| EP | 2571065 | 3/2013 |
| GB | 2520687 | 6/2015 |
| JP | 2008057383 | 3/2008 |
| JP | 2014217252 | 11/2014 |
| WO | WO 2010/100599 | 9/2010 |
| WO | WO 2012/105901 | 8/2012 |

OTHER PUBLICATIONS

Nainani, "High-Performance III-V PMOSFET", May 2011, in 131 pages.
Wang et al, Germanium-Assisted Direct Growth of Graphene on Arbitrart Dielectric Substrates for Heating Device, Nano Micro Small, vol. 13, No. 28 Jul. 26, 2017.
International Search Report and Written Opinion of PCT/EP2019/060258, dated Apr. 9, 2019, in 8 pages.
International Search Report and Written Opinion of PCT/EP2020/079756, dated Feb. 17, 2021 in 23 pages.
International Search Report and Written Opinion of PCT/EP2021/051422, dated Apr. 16, 2021 in 13 pages.

* cited by examiner

AC-DC CONVERTER CIRCUIT

TECHNICAL FIELD

The present invention relates to circuits and devices for converting an alternating current (AC) to a direct current (DC). In particular, it relates to AC-DC converter circuits for fast charging of electric vehicles and smartphones.

BACKGROUND

Electronic and electrical devices, tools, and vehicles often require an electrical battery to store charge so that they may be used even when they are not directly connected to an electrical grid. Electrical batteries may only be charged with a direct current however, electrical grids supply an alternating current.

Electric vehicles are equipped with on-board chargers inside the electric vehicle that can charge at typical 6.6 or 22 kW of power by connecting the on-board charger and electric vehicle (EV) battery to the grid or main power supply. To replenish the electrical charge of an EV battery with power from the electrical grid, one first needs to convert the current (or voltage) from AC to DC. This conversion may be performed with an AC-DC converter circuit in the on-board charger. The size of the on-board charger and hence the AC-DC converter circuit is constrained to fit the inside of car, hence are limited to low power charging with charging times of electric cars up to 8 hours, which is much longer than the typical times of refueling a gasoline car. DC fast charging instead bypasses low power on-board chargers with AC-DC power conversion external to the electric vehicle at much higher power i.e. ~50-350 kW.

An AC-DC converter circuit may e.g. feature a rectifying portion that rectifies the current and a buck/boost converter portion that stabilizes the rectified current at a substantially fixed level. Buck/boost converters generally comprise a switching portion, comprising a switching transistor, and a flywheel circuit portion that may use the transient behavior of capacitors and inductances to essentially average out the current. The switching transistor generally receives a square wave at its gate, resulting in the transistor operating as a periodical switch for the rectified current. Fast switching is desirable to achieve a more static output current. However, parasitic capacitances at the switching transistor may reduce the switching speed and require modifications to the flywheel circuit to achieve a static current. The parasitic capacitances also increase the thermal losses per switching cycle and thus decrease conversion efficiency. Furthermore, the standard commonly used silicon (Si) based metal-oxide-semiconductor field-effect transistor (MOSFET) is reaching its limits in terms of scaling and switching speed for efficient power conversion. The miniaturization of power electronics for high power is thus limited by the typical silicon MOSFETs at low switching speeds requiring large, bulky, costly, handmade passive components. Such passive components also add considerable weight to the on-board charger as well as the EV. The same may be said about e.g. wall chargers for smartphones and laptops. Incorporating different types of transistors made with different materials may however introduce integration challenges. Additionally, there are issues associated with charging of batteries at higher power such as heat generation in the battery, gas formation and parasitic irreversible chemical reactions inherent to the particular battery chemistry that are not yet sufficiently amended. There is thus room for improvements within the technical field for providing efficient and miniaturized power converters for high power charging of batteries.

SUMMARY

In view of the above, it is thus an object of the present invention to at least mitigate some of the above and other issues related to AC-DC conversion.

According to a first aspect of the invention there is provided an AC-DC converter circuit for high power charging of an electrical battery. The circuit comprises an input rectifier comprising a first node and a second node. The input rectifier is configured to receive an AC voltage at the first node and provide a rectified voltage at the second node. The circuit further comprises a first transistor, the first transistor being a depletion type transistor and comprising a first gate node, a first source node, and a first drain node. The first drain node is connected to the second node of the input rectifier. The first gate node is connected to a ground node. The circuit further comprises a second transistor, comprising a second gate node, a second source node, and a second drain node. The second drain node is connected to the first source node. The second transistor materially corresponds to the first transistor. The circuit further comprises a duty cycle control unit connected to the second gate node for providing the second transistor with a switching waveform. The circuit further comprises an output rectifier connected to the second source node or the first source node. The circuit further comprises an output electronic filter connected to the second source node or an output node of the output rectifier.

The inventor has realized that the use of a ground gated (first) transistor, that is always ON (transistor channel is open), may reduce the parasitic capacitance at the second drain node (connected to the first source node). The first transistor essentially acts as a resistor with a certain resistance for conduction between the first drain node and the first source node. This may be attributed to reducing the effective node size and thus also the area contributing to parasitic capacitances between e.g. the second drain node and the second gate node. Reducing the parasitic capacitances may increase the switching speed of the second transistor. This is because the reduced parasitic capacitances will have to be charged before the switching can be completed and because smaller capacitances take a shorter time to charge with the same voltage. This may also lead to reduced thermal losses and improved switching efficiency. Improved switching efficiency may also lead to improved AC-DC conversion efficiency and ultimately a faster charging rate of e.g. an electrical battery. Furthermore, high power conversion with a switched-mode power supply, requires low parasitic capacitances for efficient power conversion at high switching frequency with the transistors used. The inventor has also realized that high power conversion can be provided with miniaturization of AC-DC on-board power converters to efficiently fit inside an electric vehicle. Increased switching frequency allows for a smaller size and lighter switching mode power supply, this by reduced size of passive components (inductor, DC-link capacitor). Electric vehicle range is weight sensitive and the battery is already a large source of this weight. Any source of reduction of its weight is therefore desirable. Further, the inventor has also realized that forming the two transistors by using similar materials and device designs may simplify integration and improve the prospects for downscaling devices and miniaturization of AC-DC power converters. E.g. devices using the same materials may be fabricated simultaneously during the same processing steps. Devices may also be created in close proximity to each other as transition, buffer, and/or spacer structures otherwise needed to incorporate devices of different materials may be avoided. The ground gated transistor especially provides advantages when compared to a classical resistor which may be hard to achieve and integrate efficiently on a microelectronic scale.

The terms current and voltage may refer to the electrical signal between the same nodes in a circuit. They should in such cases be understood as relating to each other by application of Ohm's law. The term alternating current (AC) voltage may refer to a peak amplitude voltage (absolute or not), peak-to-peak voltage, root mean square (RMS) voltage or other ways of referring to an oscillating voltage. Accordingly, the term direct current (DC) voltage may refer to a substantially static voltage level or at least a voltage level without substantial periodic oscillations. The term rectified voltage may refer to a voltage level that still has periodicity or some sort of transient behavior but does not switch polarity. By AC-DC conversion it is implied that any AC voltage is converted to any DC voltage, i.e. the voltage levels may change.

The term rectifier may refer to any device or circuit that only transmits currents in one direction. A diode is a simple example of a rectifying device. The term transistor refers to electrical switches that conduct between a source node and a drain node based on the electrical signal (e.g. the voltage) at a gate node. Various types of transistors exist such as the already mentioned MOSFET, the bipolar junction transistor (BJT), the high-electron-mobility transistor (HEMT) sometimes also referred to as the heterojunction field-effect transistor (HFET). Variations in the operation and requirements follow with different types of transistors. Generally, transistors are formed by crystalline semiconductor material doped with impurities to achieve conditional conductivity. Transistors are generally based on a semiconductor substrate and integrated en masse to form advanced electronic digital and analog circuits. Many transistor types such as the MOSFET and HEMT may feature drain-source symmetry. This means that what is referred to as the drain and the source is merely subject to convention. Flipping the source and drain connections of e.g. a regular MOSFET in a circuit may have no effect on circuit operation. The wording that the transistors materially correspond to each other may be understood as the transistors comprising the same materials or at least being based on a similar material system.

The term duty cycle control unit may refer to a device that outputs a periodic waveform such as a square waveform. The ratio between the duration of the high and low portions of the waveform may be used to control the output DC level. The duty cycle control unit may be adapted to change the waveform based on a measured DC voltage output by the circuit. Use of a duty cycle control unit to switch the second transistor may be advantageous as it allows for controlling DC output to feature e.g. a constant current or a constant voltage. The term electronic filter may refer to just single a component or a small part of the circuit that functions as a way to filter the electrical signal based on a parameter such as frequency. E.g. inductors and capacitors may be used in an electronic filter. As inductor and capacitor charge behavior is transient, circuits containing these will respond different to changing frequency signals. This may be used to create e.g. low-pass, high-pass, and band-pass filters.

The term node should be understood as referring to electrical nodes in the circuit that may feature an electric charge, a voltage value or a current flowing through it. Most commonly, nodes refer to metal interconnection nodes between devices and components in the circuit, but nodes may also be understood in other ways. For example, portions or volumes of semiconductor material may act as a node in some embodiments.

According to some embodiments the first and second transistors are both HEMTs. Alternatively, either the first or the second transistor may be a HEMT. The embodiment where both transistors are HEMTs however allows for the two to be formed simultaneously and adjacently integrated. HEMTs generally provide, as is implied by the name, better electron transport and thus allows higher currents for the same volume of semiconductor material. This may be attributed to HEMTs utilizing the so-called two-dimensional electron gas (2DEG) at the interface between the carrier and barrier layers. Compared to MOSFETs where an oxide is used for the layer closest corresponding to the barrier layer, the barrier layer in HEMTs is often a semiconductor of higher band gap than that of the carrier layer. The 2DEG provides improved electron transport as the essentially two-dimensional plane provides an increased mean free path (MFP) for the charge carriers, e.g. electrons between the source and drain regions of the transistor.

According to some embodiments the first and second transistors are gallium nitride transistors. Alternatively, either the first or the second transistor may be a gallium nitride transistor. The term gallium nitride transistor may refer to transistors of various types, e.g. MOSFET or HEMT, featuring or being based on gallium nitride (GaN) or materials in the III-nitride (III-N) material system. The term may further refer to the carrier or channel layer of the transistor comprising GaN. The embodiment where both transistors are gallium nitride transistor allows for the two to be formed simultaneously and adjacently integrated. Gallium nitride transistors may be advantageous because of inherent material properties of GaN. GaN has superior electron mobility compared to silicon providing more efficient conduction with lower thermal losses. GaN devices, such as transistors, may be made smaller than, but still retain the performance of their Si counterparts. Thus, GaN devices may be cheaper to fabricate. GaN devices generally exhibit higher breakdown voltages than Si devices making them suitable for high voltage applications such as for charging electric vehicle batteries at ~400V. GaN devices may enable higher switching frequencies than Si devices. GaN transistors may also provide more efficient switching than Si devices. GaN transistors may be advantageous for high power conversion applications.

High power conversion causes large switching losses at high frequencies for silicon transistors in terms of heat. The higher power during switching with silicon transistors requires larger and bulkier capacitive and inductive components. The parasitic capacitance has to be reduced in order to obtain fast switching or else a delay in the switching time is introduced.

According to some embodiments the input rectifier is a half-wave rectifier comprising at least one diode. A half-wave rectifier is a rectifier that transmits one half of the AC voltage, i.e. the voltage of either negative or positive polarity. Such a rectifier may be made very small and with low complexity.

According to some embodiments the input rectifier is a full-wave rectifier comprising at least two diodes. The input rectifier further comprises a third node. The input rectifier is configured to receive an AC voltage between the first node and the third node. A full-wave rectifier is a rectifier that transmits one half of the AC voltage, as is, and transforms the other half to the same polarity and transmits the transformed half as well. Alternatively, the full-wave rectifier may be seen as outputting the absolute value of the input AC voltage over time. Therefore, a full-wave rectifier generally rectifies more of initial AC voltage. Thus, more of the electrical energy is also converted. The full wave rectifier, generally larger than the half-wave rectifier, may still be made relatively small (e.g. using two or four diodes) and with low complexity. Full-bridge and diode-bridge are alternate nomenclature associated with full-wave rectifiers using four or more diodes arranged in a bridge circuit.

According to some embodiments the AC-DC converter circuit further comprises a control circuit for monitoring the output voltage level. The control circuit is configured to provide feedback to the duty cycle control unit based on the monitored output voltage level. The control circuit feedback may be used to set and stabilize the output DC voltage level of the AC-DC converter circuit to a desired fixed voltage level.

According to some embodiments the first transistor and the second transistor are integrated monolithically on a same substrate layer structure. Monolithically refers to, in this regard, having the transistors being formed integrated on the same semiconductor substrate (e.g. wafer). As such, size and costs of the circuit may be reduced. Furthermore, monolithic integration of the two transistors may allow for a reduction of the size of the intermediate node (first source node/second drain node) and thus further reduce the associated parasitic capacitances.

According to some embodiments the substrate layer structure comprises a silicon substrate layer. Silicon (Si) substrates, e.g. wafers, are generally cheaper and less complex to manufacture. Si is the baseline of the electronics industry and it is therefore advantageous to incorporate the AC-DC converter circuits on such substrates for closer integration with other circuits and electronics. This is also the case for devices not based on Si, e.g. GaN based devices. In particular, conventional GaN devices require expensive and complex substrate materials such as sapphire ($\alpha$-$Al_2O_3$) or silicon carbide (SiC).

According to some embodiments the output rectifier is a gallium nitride diode. Any diodes of the input rectifier, if present, are gallium nitride diodes. This may be advantageous, in particular, if GaN transistors are used as the diodes and transistors may then be more closely integrated. For example, diodes and transistors may in this way be formed in parallel onto the same semiconductor material.

According to some embodiments the first transistor comprises a first carrier layer structure above a substrate layer structure and a first barrier layer structure above the first carrier layer structure. The first gate node and the first drain node are located above the first barrier layer structure. The nodes are physically separated by spacer structures. Similarly, the second transistor comprises a second carrier layer structure above the substrate layer structure and a second barrier layer structure above the second carrier layer structure. The second gate node and the second source node are located above the second barrier layer structure. The nodes are physically separated by spacer structures. The first and second carrier layer structures comprise a first semiconductor material. The first and second barrier layer structures comprise a second semiconductor material.

The carrier and barrier layer structures should be understood as comprising different semiconductor materials. The term spacer structure(s) should be understood as physical structures, substantially non-conducting, such as dielectrics. By arranging the layer structures, nodes, and spacers accordingly, formation of HEMT or HFET devices is enabled.

According to some embodiments the first carrier layer structure is physically separated from the second carrier layer structure by a spacer structure. The first barrier layer structure is physically separated from the second barrier layer structure by the same spacer structure. As such interference and/or leakage between the two devices may be minimized.

According to some embodiments the first carrier layer structure is connected to the second carrier layer structure. Similarly, the first barrier layer structure is connected to the second barrier layer structure. As such device complexity may be reduced and fabrication complexity may be reduced as e.g. as semiconductor etching or trench forming may be avoided. This is particularly advantageous for GaN based devices.

According to a second aspect of the invention there is provided an AC-DC converter device comprising the AC-DC converter circuit according to the first aspect. The device further comprises an interface for receiving an AC voltage from an AC voltage source and an interface for providing a DC voltage to an electrical battery. The electrical battery may be an electrical battery of an electronic vehicle or an electrical battery of a mobile electronic device.

Such a device would be advantageously suitable for electric charging of electrical batteries. Furthermore, all above mentioned improvements relating to AC-DC conversion efficiency of the converter circuit are inherited by the AC-DC converter device. Dual-phase charging, i.e. initially a duration of constant current charging followed by a duration of constant voltage charging, may be advantageous as it provides fast battery charging without excessively stressing the battery. Such dual-phase charging may be employed by the suggested AC-DC converter device. The device (and the converter circuit) may be configured for dual-phase (constant current, constant voltage) charging. The interfaces for AC input and DC output may in the simplest form be understood as electrical terminal nodes. The input interface may e.g. be made suitable for receiving an AC voltage from an electrical grid.

The AC-DC converter device may be configured to provide a DC voltage to the electrical battery of an electric vehicle. Efficient conversion of AC to DC is advantageous for charging the electrical battery of an electric vehicle (EV). Improved GaN devices may provide faster charging with higher power devices. GaN devices are further advantageous as they may be made smaller and thus provide improvements for on-board charging circuits of EVs, allowing for faster and more efficient charging using existing electrical grid infrastructure.

The AC-DC converter device is configured to provide a DC voltage to the electrical battery of a mobile electronic device. The term mobile electronic device may refer to e.g. mobile phones, laptop computers, tablets, remote controls, calculators, etc. The skilled person understands that the above list is not exhaustive and that similar devices with an electrical battery and e.g. data processing capacity may be considered. Similar advantages as those of the EV may be expected. In particular, the prospects of smaller and/or more efficient devices may be advantageous.

According to a third aspect of the invention there is provided a method for charging an electrical battery of an electric vehicle comprising, in addition to the electrical battery, a traction motor and the AC-DC converter circuit of the first aspect. The method comprises:
  decelerating a motion of the electric vehicle;
  generating an AC type current from said traction motor by
    the deceleration of the motion of the electric vehicle;

converting the generated AC type current to a DC type current by the AC-DC converter circuit; and charging the electrical battery with the DC type current.

According to a second aspect of the invention there is provided a regenerative braking system of an electric vehicle, the regenerative braking system comprising:

an electrical battery;

a traction motor adapted to generate an AC type current;

a braking system adapted for decelerating the electric vehicle;

the AC-DC converter circuit of the first aspect configured to convert an AC type current from the traction motor to a DC type current and charge the electrical battery; and a DC-AC converter circuit configured to convert a DC type current from the electrical battery to an AC type current to power the traction motor.

BRIEF DESCRIPTION OF THE DRAWINGS

The above, as well as additional objects, features and advantages of the present invention, will be better understood through the following illustrative and non-limiting detailed description of preferred embodiments of the present invention, with reference to the appended drawings, where the same reference numerals will be used for similar elements, wherein.

DETAILED DESCRIPTION

The present invention will now be described more fully hereinafter with reference to the accompanying drawings, in which embodiments of the invention are shown. The systems and devices disclosed herein will be described during operation.

Figure 1:
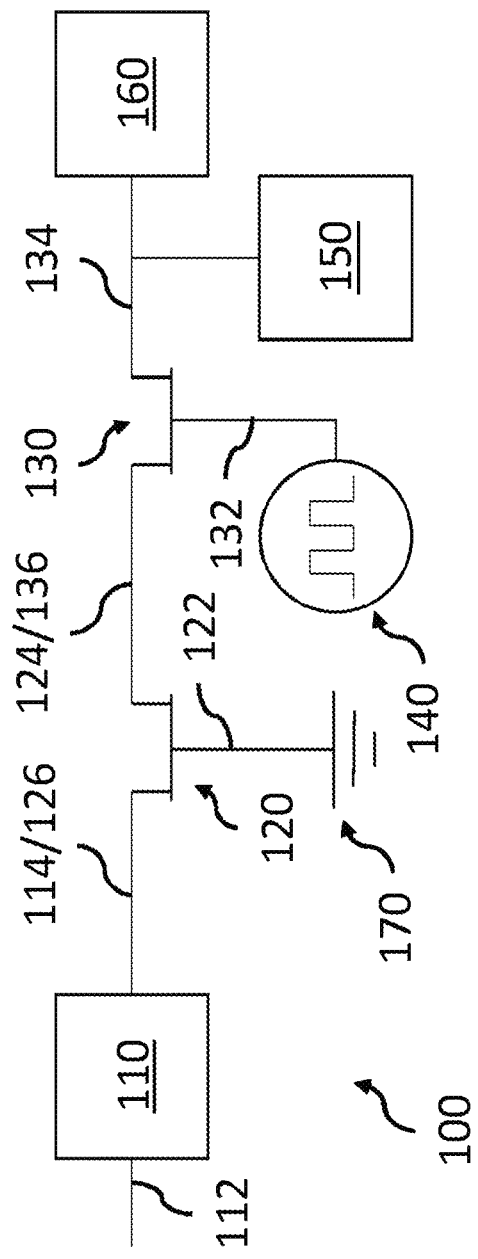
FIG. 1 shows a basic schematic of an AC-DC converter circuit according to the first aspect being buck configured.
Figure 2:
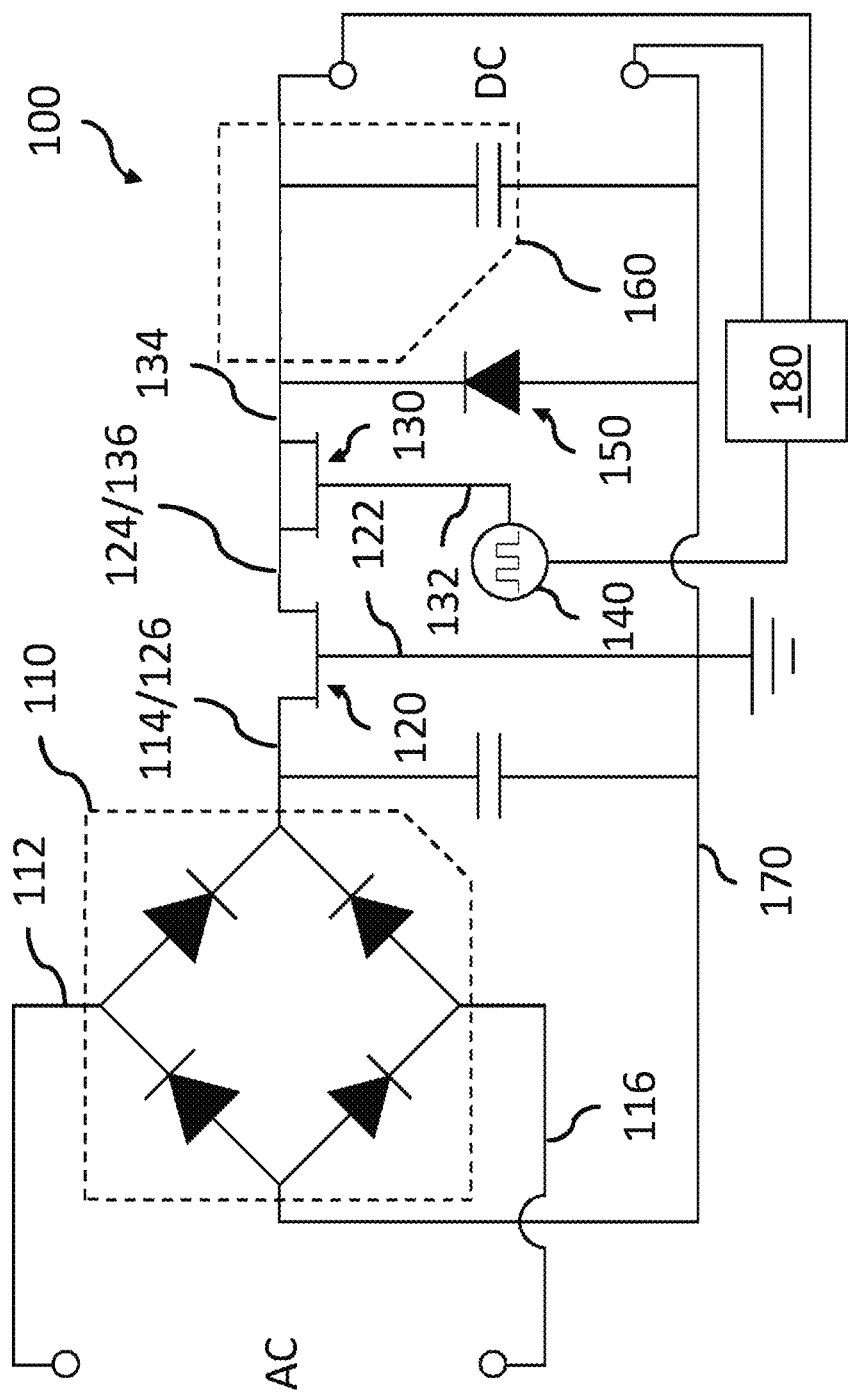
FIG. 2 shows a more detailed schematic of a circuit according to the first aspect being buck configured with some optional features of embodiments also present.

FIG. 1 and FIG. 2 both illustrate schematics of an AC-DC converter circuit 100, albeit with different levels of detail. FIG. 1 and FIG. 2 specifically show a buck type AC-DC converter circuit 100.

The circuit 100 may convert an AC voltage (or current), to a stable and substantially static DC voltage (or current). The AC voltage may be in the form of a sine wave voltage oscillating between 45 and 65 Hz. Preferably the oscillation is either substantially 50 or 60 Hz. The voltage level may oscillate around 0 V or another fixed (DC) voltage offset. The AC voltage may have a RMS value between 100 and 500 V. Preferably the AC voltage has a RMS value substantially or averaged at around 110 V, 115 V, 220 V, 230 V, 380 V, or 400 V. For the sake of clarity and to avoid tautology, a DC type current may be used to refer to a direct current and an AC type current may be used to refer to an alternating current.

The circuit 100 comprises an input rectifier 110 that is configured to rectify the AC voltage received at a first node 112. The first node 112 may act as an input node for the input rectifier 110. The input rectifier be connected to a third node 116 acting as an input node for the input rectifier 110. The AC voltage may be received at only the first node 112 or alternatively between the first node 112 and the third node 116. The input rectifier 110 provides a rectifier voltage (or current) at a second node 114, acting as an output node of the input rectifier 110.

The input rectifier 110 may comprise one or more diodes, more preferably two or more diodes, and most preferably four or more diodes. The input rectifier 110 may be a half-wave or full-wave rectifier. The input rectifier 110 may comprise a diode bridge, i.e. four diodes connected in series. The diodes may be arranged to form two parallel paths, both conducting from the ground node 170 to the second node 114 with the first node 112 and third node 116 connecting between the diodes of either path. Such an input rectifier is exemplified in FIG. 2.

When an AC voltage, without a DC component, is connected between the first node 112 and the third node 116, the first half of the AC wave period would cause the absolute value of the oscillating current to be transmitted through either the top or the bottom path of the input rectifier 110, as shown in FIG. 2. For the second half of the AC wave period, the absolute value of the oscillating current is transmitted through the other path of the input rectifier 110. As such the voltage may be rectified to have the same polarity once it exits the input rectifier at the second node 114.

Further alternatives for the input rectifier 110 may include e.g. a center-tapped rectifier, comprising two diodes, or a voltage doubler circuit, comprising one or two diodes.

The diodes of the input rectifier 110 may be gallium nitride (GaN) diodes. The diodes may be based on the semiconductor pn-junction. The pn-junction is essentially a transition between two semiconductor materials doped with different atomic impurities. Dopant impurities are used to introduce charge carriers (electrons and holes) into the semiconductor materials. For a silicon (Si) diode, p-type dopants may include e.g. boron (B) and n-type dopants may include nitrogen (N) or phosphorus (P). For a GaN diode, p-type dopants may include magnesium (Mg) and n-type dopants may include carbon (C) or Si. The diodes referred to herein for the input rectifier 110 may preferably be Schottky diodes. Schottky diodes may alternatively be referred to as Schottky barrier diodes or hot-carrier diodes. Schottky diodes distinguish themselves from regular pn-junction diodes by being formed as semiconductor junction with a metal. Schottky diodes feature a low forward voltage drop and very fast switching action. This lower forward voltage requirement allows for higher switching speeds and better system efficiency.

In some embodiments, the diodes may be formed on a GaN-on-Silicon substrate. For Schottky diodes the substrate comprises an AlGaN/GaN/Si heterostructure with a metal. A Schottky diode contact metal structure of Pd/Au may be provided on top of the of the AlGaN/GaN/Si. An ohmic contact of Ti/AlCu/Ni/Au may also be provided where AlCu is an aluminum copper alloy. For pn-junctions the substrate comprises a p-GaN/n-GaN homojunction.

In some embodiments it is preferred that four Schottky diodes or p-GaN/n-GaN homojunctions are integrated on the same GaN-on-Silicon substrate to form a diode bridge on the substrate.

The circuit 100 further comprises a first transistor 120. The first transistor comprises a first gate node 122, a first source node 124, and a first drain node 126. The circuit 100 further comprises a second transistor 130. The second transistor comprises a second gate node 132, a second source node 134, and a second drain node 136. The first transistor 120 and the second transistor 130 may collectively be referred to as the transistors 120, 130. The transistors 120, 130 may be depletion mode (normally on) or enhancement mode (normally off). The transistors 120, 130 may be Si based transistors, GaN based transistors, SiC based transistors or any combination of the above.

The transistors 120, 130 may be MOSFETs. MOSFETs may feature gate oxide comprising e.g. silicon oxides ($SiO_x$) and/or hafnium oxides (HfOx) and/or aluminium oxides (AlOx). MOSFETs may feature doped semiconductor regions. MOSFETs may be either positive channel (PMOS) or negative channel (NMOS) devices.

Figure 3:
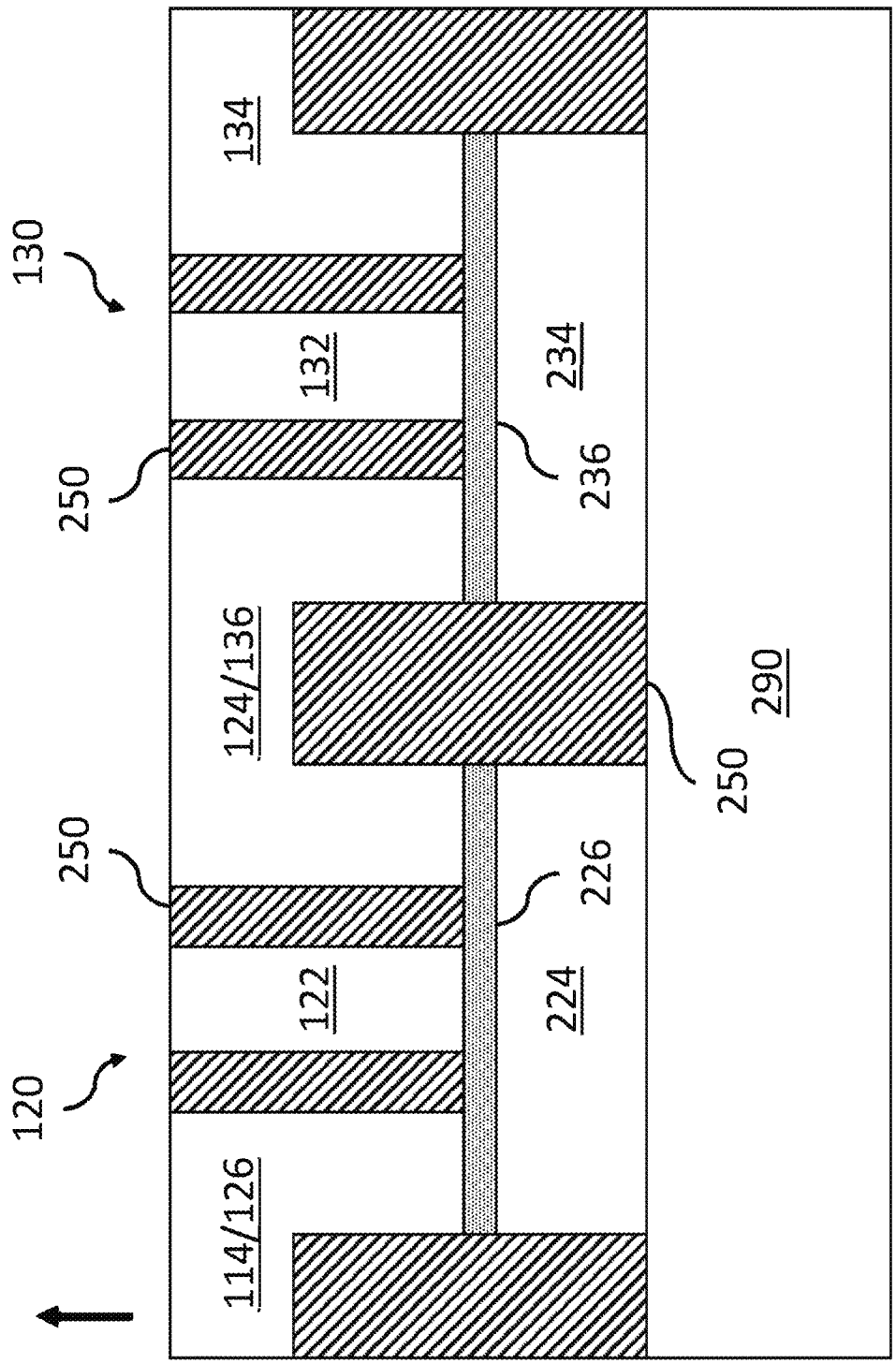
FIG. 3 shows a schematic cross section of semiconductor layer structures and devices according to embodiments.
Figure 4:
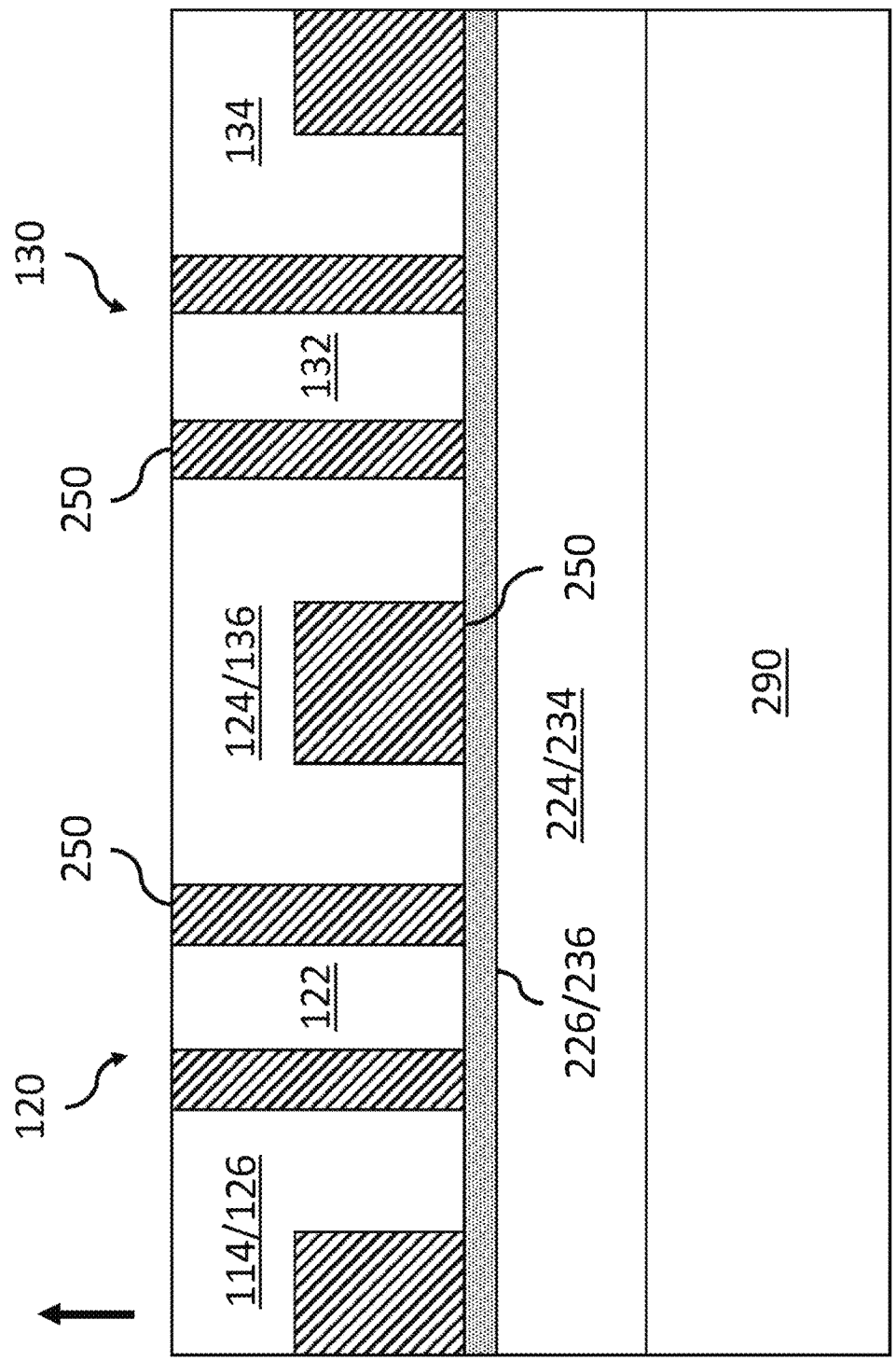
FIG. 4 shows a schematic cross section of semiconductor layer structures and devices according to further embodiments.
Figure 5:
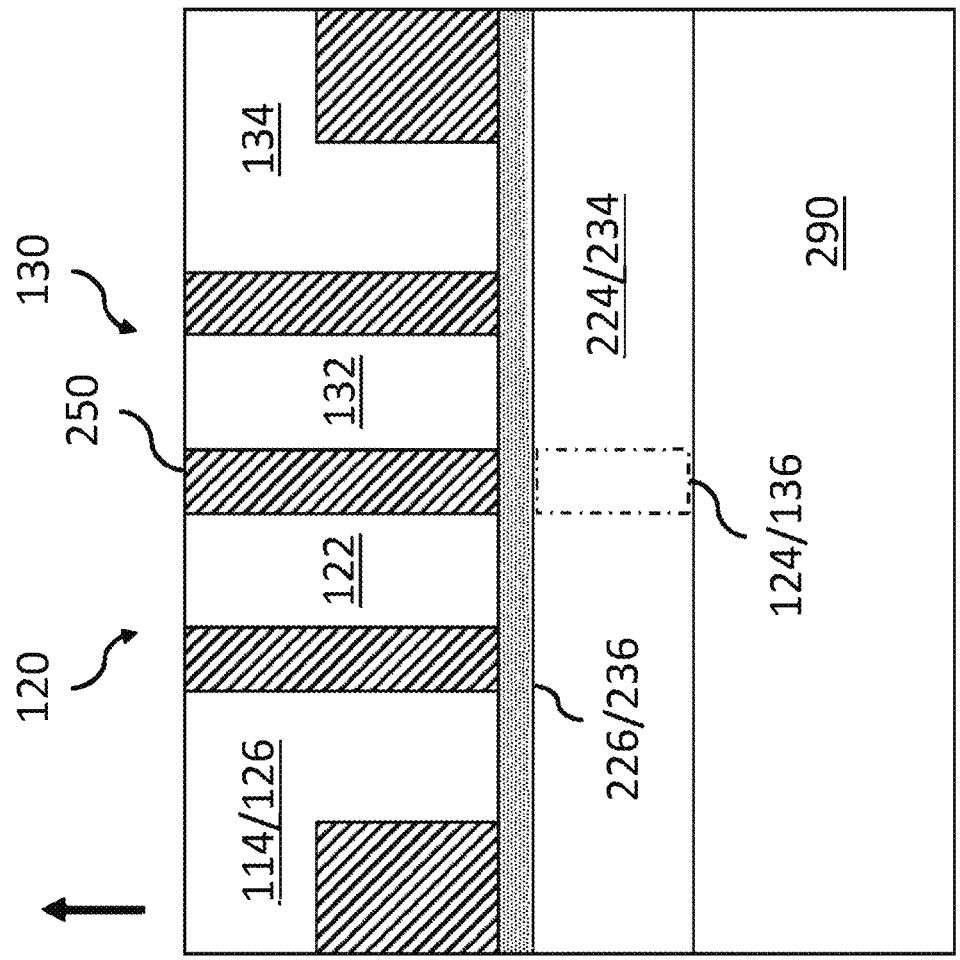
FIG. 5 shows a schematic cross section of semiconductor layer structures wherein the transistors are co-arranged as a dual-gate device.

The transistors 120, 130 may also be HEMTs/HFETs or any combination of HEMTs and MOSFETs. HEMTs may comprise a carrier layer and a barrier layer above the carrier layer. FIG. 3, FIG. 4, and FIG. 5 all show schematic cross sections of transistors being HEMT/HFET type devices comprising carrier layer structures (first and second) 224, 234 and barrier layer structures 226, 236 above the carrier layer structures (first and second) 224, 234. The 2DEG may form on the carrier layer structure side of the interface between the carrier layer structures 224, 234 and the barrier layer structures 226, 236. The straight thick arrows at the top left corner of each figure (based on the orientation of the text) indicates the bottom-up direction, i.e. the direction of device fabrication starting with a bottom substrate. Similarly to the MOSFET case, HEMTs may also feature a gate oxide. The gate oxide in HEMTs may be intermediate to the gate nodes 122, 132 and the barrier layer structures 226, 236.

FIG. 3 shows the first transistor 120 comprising a first carrier layer structure 224 located above a substrate layer structure 290 and a first barrier layer structure 226 located above the first carrier layer structure 224. The first gate node 122, the first source node 124, and the first drain node 126 are shown located above the first barrier layer structure 226. The first gate node 122 is shown located between the first source node 124 and the first drain node 126. The nodes are shown to be physically and spatially separated by spacer structures 250. The physical spacing imposed by the spacer structures 250 may e.g. be in the range 1 nm to 1 µm.

FIG. 3 further shows the second transistor 130 comprising a second carrier layer structure 234 located above the substrate layer structure 290 and a second barrier layer structure 236 located above the second carrier layer structure 234. The second gate node 132, the second source node 134, and the second drain node 136 are shown located above the second barrier layer structure 236. The second gate node 132 is shown located between the second source node 134 and the second drain node 136. The nodes are shown to be physically and spatially separated by spacer structures 250. The physical spacing may, similarly to the first transistor 120 e.g. be in the range 1 nm to 1 µm.

The substrate layer structure 290 may comprise a silicon (Si) substrate layer. The Si substrate layer may be substantially monocrystalline. The substrate layer structure 290 may be a wafer with a diameter of between 1 inch and 20 inches. The transistors 120, 130 may be monolithically integrated on the same substrate layer structure 290. The substrate layer structure 290 may comprise several sublayers such as buffer layers, transition layers, and capping layers. The substrate layer structure 290 may feature layers configured to match material parameters such as thermal expansion coefficients and lattice mismatch an interface between the substrate layer structure 290 and the carrier layer structures 224, 234. One such layer may include a nanowire array reinforced transition layer. Nanowires may be GaN nanowires and the transition layer may enable improved GaN crystal quality and device performance for the above carrier layer structures 224, 234.

The carrier layer structures 224, 234 may comprise a first semiconductor material. The carrier layer structures 224, 234 may at least partially comprise or substantially consist of the first semiconductor material. The barrier layer structures 226, 236 may comprise a second semiconductor material. The barrier layer structures 226, 236 may at least partially comprise or substantially consist of the second semiconductor material.

The first and second semiconductor materials may be a material in the III-N material system, e.g. GaN, AlGaN, InGaN etc. The first and second semiconductor materials may at least partially comprise or substantially consist of III-N material of the following composition: $Al_xIn_yGa_{1-x-y}N$, wherein $0 \leq x \leq 1$, $0 \leq y \leq 1$, $x+y \leq 1$. Preferably, the carrier layer structures 224, 234 comprise GaN. Preferably, the barrier layer structures 226, 236 comprise $Al_xGa_{1-x}N$, wherein $0 \leq x \leq 1$. AlGaN in its various composition generally provides a larger band gap than GaN and it is thus the material of choice for the barrier layer structures 226, 236.

FIG. 3 shows the first and second carrier layer structures 224, 234 being physically separated from each other the by a spacer structure 250. The figure further shows the first and second barrier layer structures 226, 236 being physically separated from each other the by the same spacer structure 250. The spacer structure 250 between the two transistors may be formed by e.g. etching a trench into the first and second semiconductor materials and depositing the spacer material. The physical spacing imposed by the spacer structure 250 may e.g. be in the range 1 nm to 1 µm.

The spacer structures 250 discussed herein may generally refer to layers of non-conducting (insulating) materials operating as physical spacers, passivation, and isolation structures. Examples of materials that may be used includes dielectric materials and oxides such as SiOx (e.g. $SiO_2$) or silicon nitride $Si_3N_4$. Dielectric materials with a low K value, i.e. low relative dielectric constant or permittivity materials, are desirable. E.g. a spacer structure of a low-K material may reduce the parasitic capacitance over the spacer structure comparatively to having the spacer structure be made with a higher K value material. The spacer structures 250 may be air gaps or vacuum gaps to approach the lowest possible K value, i.e. 1, and thus reduce parasitic capacitances over the spacer structures 250. The parasitic capacitance may be understood as being between the gate node 132 and the source nodes 134 ($C_{gs}$) and/or between the gate node 132 and the drain nodes 136 ($C_{gd}$) and/or between the gate node 132 and the semiconductor bulk ($C_{gb}$). The semiconductor bulk may e.g. refer to the barrier layer structures 226, 236 and/or the carrier layer structures 224, 234 and/or the substrate 290.

The gate, source and drain nodes of the transistors 120, 130 may be formed by a conducting material such as metallic materials or degenerately doped semiconductor materials. Examples of node materials include copper (Cu), aluminium (Al), titanium (Ti), nickel (Ni), gold (Au), silver (Ag), wolfram or tungsten (W) as well as alloys of all the above. Further examples include polycrystalline Si and titanium nitride (TiN).

FIG. 4 shows an alternate embodiment without any spacer structure between the first and the second carrier and barrier layer structures. As such the first carrier layer structure 224 and the second carrier layer structure 234 form a common carrier layer structure 224, 234. Similarly, the first barrier layer structure 226 and the second barrier layer structure 236 form a common barrier layer structure 226, 236.

FIG. 5 shows a schematic cross section of the two transistors being co-arranged to form a single dual-gate device. In the figure, the intermediate node 124, 136 is located within a combined carrier layer structure 224, 234. Such a device may provide beneficial behavior as the intermediate node 124, 136 may be miniaturized with lower parasitic capacitances as an effect.

The first transistor 120 is coupled with the first gate node 122 to the ground node 170, or another ground node. The circuit does not need to share the same ground node 170 but does so in many embodiments and the figures. As the first gate node 122 is ground connected, the first transistor 120 becomes essentially a passive device. As such the transistor is either always on or always off depending on the operation of the transistor. The first transistor 120 may therefore preferably be a depletion mode (normally on) transistor. The first transistor 120 may then feature a value for on-state resistance (Ron). The on-state resistance may refer to the electrical resistance between the first source node 124 and first drain node 126. As such, the first transistor 120 may act as a resistor that may be miniaturized for integration on a chip with other passive and active microelectronic components. The ground node 170 may be set at 0 V DC. A static DC voltage offset may alternatively be connected to the first gate 122 at least making it more viable to use an enhancement mode first transistor 120.

In the circuit 100, the first drain node 126 is connected to the second node 114, i.e. the output node of the input rectifier 110. The first source node 124 is connected to the second drain node 136. When connected, these nodes may be referred to as the intermediate node 124, 136. The transistors 120, 130 may be understood as being connected in series.

The circuit 100 further comprises a duty cycle control unit 140. The duty cycle control unit 140 is connected to the second gate node 132. The duty cycle control unit 140 is configured to provide the second transistor 130 with a switching waveform. The switching waveform may be in the form of a transient or AC voltage with a square waveform. Other waveforms such as sine waveforms may be used. The square waveform should be understood as substantially square, i.e. with very high frequency edges. The square waveform may also be described as having very small rise and fall times.

The waveform may feature various ratios between high- and low-level durations. This may be used to control the output DC voltage level through step-down conversion. E.g. a 1:1 ratio between high- and low-level durations of the waveform may step-down the voltage to half of the input voltage. This is desirable as voltage levels directly of the grid may be too large for efficient and/or safe and/or practical charging of batteries. Through the duty cycle control unit 140, DC voltage step-down may be altered throughout a charging process. The ratio between the input voltage and the output voltage may be referred to as the step-down ratio.

The second transistor 130, may also be referred to as the switching transistor 130 as it performs switching contrary to general operation of the first transistor 120 which is ground gated. One of, or both transistors 120, 130 may be nanowire transistors with wrap gate nodes 122, 132.

Figure 9:
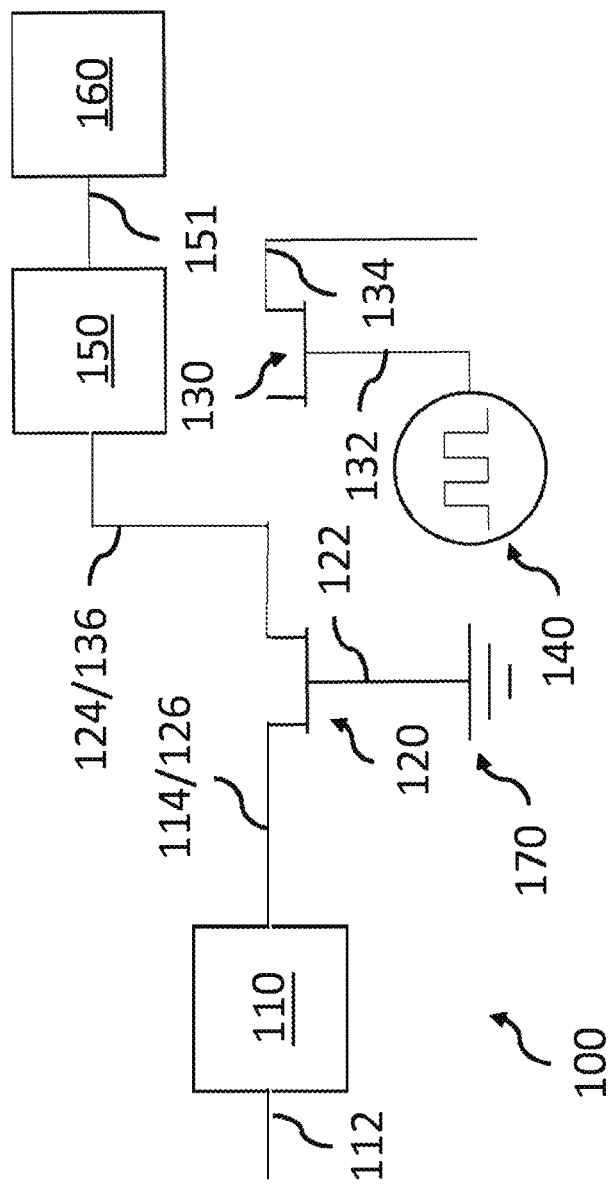
FIG. 9 shows a basic schematic of an AC-DC converter circuit according to the first aspect being boost configured.
Figure 10:
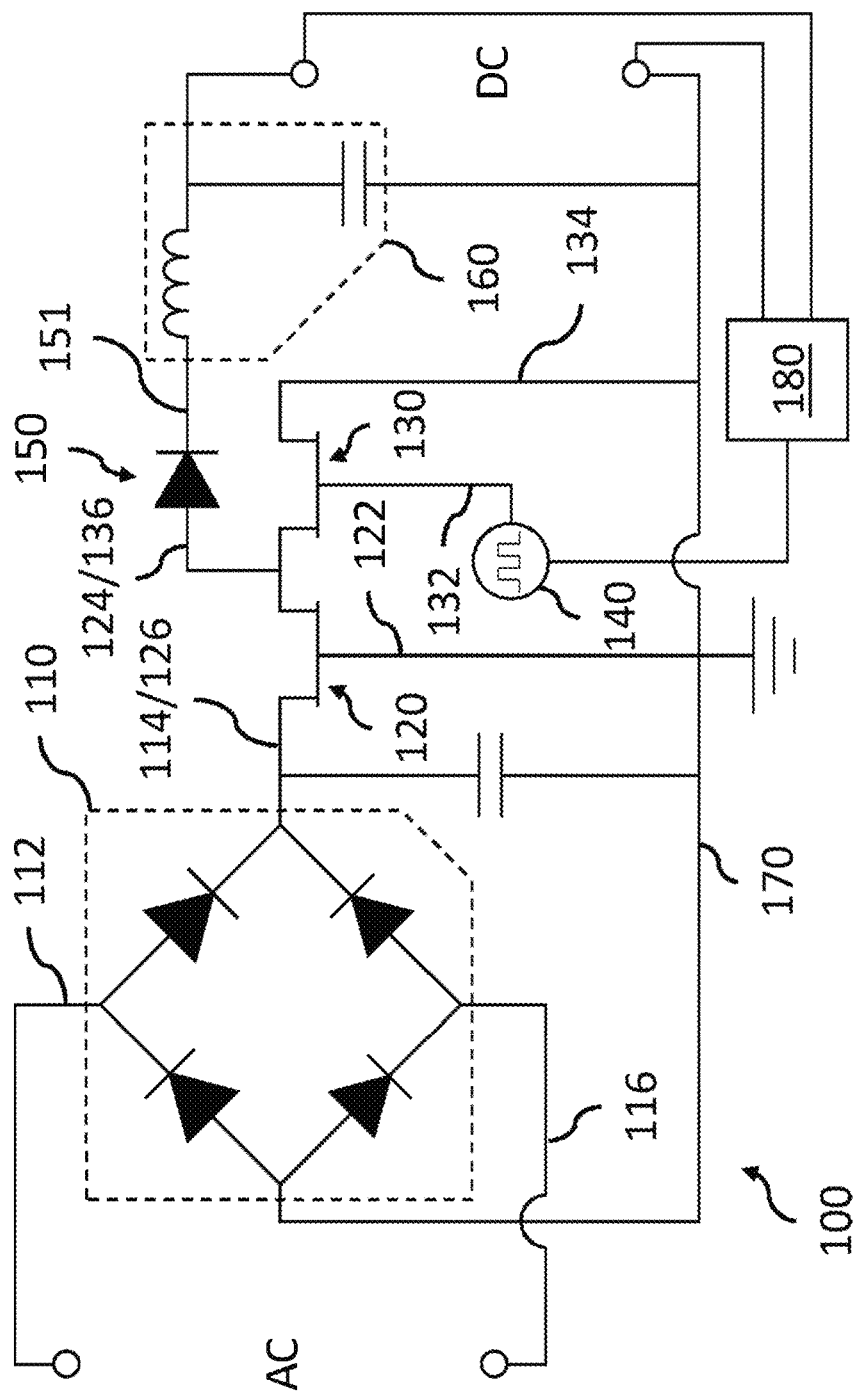
FIG. 10 shows a more detailed schematic of a circuit according to the first aspect being boost configured with some optional features of embodiments also present.

The circuit 100 further comprises an output rectifier 150 connected to the second source node 134 (buck configured, see FIGS. 1-2) or the first source node 124 (boost configured, see FIGS. 9-10). The output rectifier 150 comprises at least one diode. The output rectifier 150 may more specifically be a GaN diode. The output rectifier 150 may be a Schottky diode. Schottky diodes generally feature lower forward voltage drops compared to regular pn-junction diodes which may lead to faster recovery times and increased efficiency of the output rectifier 150 and/or the AC-DC converter circuit 100. The same advantages may apply if Schottky diodes are used in the input rectifier 110.

The output rectifier 150 may be connected to conduct from the ground node 170 to the second source node 134. It should be noted that when reference herein is made to electrical conduction directions, they should be understood as the direction of the current, i.e. the direction opposite to the flow of the electrons. The output rectifier 150 prevents, potentially destructive, charge from building accumulating at the second source node 134 when the switching transistor 130 is switched off by providing a conduction path from the ground node 170 to the second source node 134.

The circuit 100 further comprises an output electronic filter 160 connected to the second source node 134 (buck configured, see FIGS. 1-2) or an output node 151 of the output rectifier 150 (boost configured, see FIGS. 9-10). The output electronic filter 160 may comprise an inductor and a capacitor, as shown in FIG. 2. The inductor and capacitor may be connected in series. The output electronic filter 180 may additionally comprise a resistor or a transistor arranged as a resistor. Inductors and capacitors may be formed by conventional microelectronic fabrication methods e.g. during back end of line processing (BEOL).

The output electronic filter 160 and the output rectifier 150 may together be referred to as the flywheel circuit. This is due to the similarities to the function of a mechanical flywheel in maintaining momentum for a cycle where energy is only added intermittently. The transient behavior of the inductor and capacitor allow them to charge when the switching transistor is switched on and then release the charge when the switching transistor is switched off. Thus, an essentially static output DC voltage is achieved.

The output DC voltage of the circuit 100 may be extracted from the node between the inductor and the capacitor. The output DC voltage of the circuit may alternatively be understood as the voltage over the capacitor and be extracted at terminals nodes on either side of the capacitor.

The circuit 100 may further comprise an input electronic filter, as shown in FIG. 2. In the figure the input electronic filter is realized as a capacitor between the second node 114 and the ground node 170. The input electronic filter may function as a reservoir capacitor that functions to smooth out the rectified voltage at the second node 114 to a relatively static level. The input electronic filter may additionally comprise an inductor and/or a resistor. The resistor may be realized as a transistor arranged as a resistor.

The circuit 100 may further comprise a control circuit 180 for monitoring the output voltage level. The control circuit 180 may be configured to provide feedback to the duty cycle control unit 140 based on the monitored output voltage level. The control circuit 180 may e.g. provide the duty cycle control unit 140 with feedback or instructions related to the required DC voltage step-down.

In FIG. 2 the control circuit 180 is shown to connect to the DC output terminals of the circuit 100 and to the duty cycle control unit 140. The control circuit 180 may be a feedback circuit such as a negative feedback circuit. The control circuit 180 may comprise at least one operational amplifier (OP-amp). The control circuit 180 may further comprise a proportional-integral-derivative controller (PID controller). The control circuit 180 may alternatively comprise just parts of the PID controller e.g. a P, I, D, PI, ID, or PD controller. The control circuit 180 may be a simple electronic circuit or an integrated circuit with digital computing and/or data processing capacity.

The AC-DC converter circuit 100 may be described as a buck converter circuit. The AC-DC converter circuit 100 may alternatively be a boost converter circuit. The AC-DC converter circuit 100 may also be a combination of the both, i.e. a buck boost converter circuit.

Generally, boost and buck converters refer to DC-DC converters with voltage control with step-up and step-down capability, respectively. The AC-DC converter circuit 100 may be understood as a DC-DC buck converter with an input rectifier 110 such as a diode bridge e.g. comprising four GaN diodes.

A buck converter circuit may be preferred for charging of an electrical battery of a smartphone. Such a converter may preferably be configured to step-down and convert an input voltage of 230 V AC to an output voltage of approximately 9 V DC.

A boost converter circuit may be preferred for charging of an electrical battery of an electric vehicle. Such a converter may preferably be configured to step-up and convert an input voltage of 230 V AC to an output voltage of approximately 300-400 V DC As previously mentioned, FIG. 1 and FIG. 2 show a buck type AC-DC converter circuit. FIG. 9 and FIG. 10 shows a boost type converter circuit characterized in that the output rectifier 150 is connected at the node 124, 136, intermediate to the two transistors 120, 130. The output filter 160 is in such embodiments connected to an output node 151 of the output rectifier. The second source node 134 may in such embodiments connect to the ground node 170.

Figure 6:
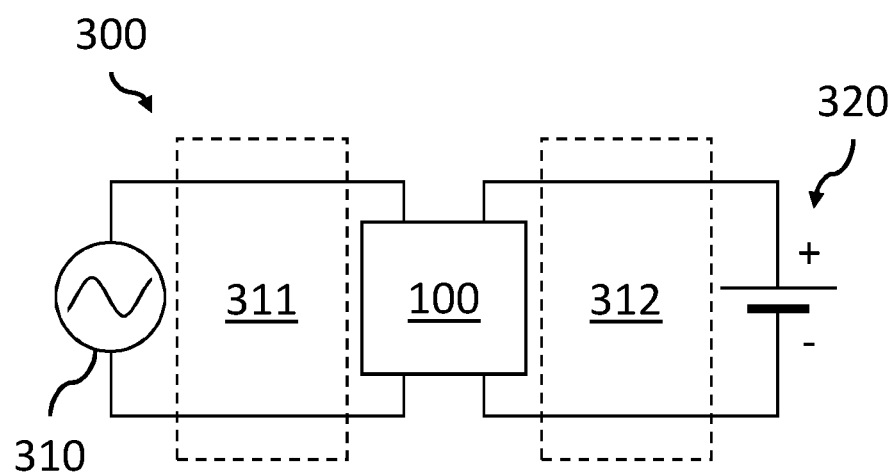
FIG. 6 shows a schematic of an AC-DC converter device according to the second aspect.

FIG. 6 shows the circuit 100 being comprised within an AC-DC converter device 300. The device 300 further comprises an interface for receiving an AC voltage 311 from an AC voltage source 310 and an interface for providing a DC voltage 312 to an electrical battery 320.

The AC voltage source 310 may be understood as a distribution point for distributing an AC voltage from an electrical grid such as e.g. an electrical wall socket. The interface for receiving an AC voltage 311 may be understood as a socket plug connection comprising at least one, preferably at least two, electrically conducting connectors. The interface for providing a DC voltage 311 may be understood as at least one electrically conducting connector.

The electrical battery 320 may be understood as any secondary, i.e. rechargeable, electrical battery. The electrical battery 320 may further be understood as any electrochemical device or cell for storing electric energy in chemical form e.g. a lead acid battery, a lithium ion battery, or a nickel metal hydride battery (NiMH).

An electrochemical cell may have three parts; an anode, an electrolyte and a cathode. An example of an electrochemical cell for a lithium-ion battery may be described as

[LiC//polymer gel//CoO2+polymer]

with two half-cell reactions for the anode and the cathode.

Anode: LixC6 (s)=xLi+6C+xe−

Cathode: xLi++CoO2 (s)+xe−=LixCoO2 (s).

In the above, x corresponds to a variable that may e.g. be an integer, Li corresponds to the element lithium, C corresponds to the element carbon, O corresponds to the element oxygen, Co corresponds to the element cobalt, e− corresponds to an electron, and (s) indicates that the chemical compound is solid.

The chemical reaction governing the charging of a battery is described by the Gibbs free energy $\Delta G$. For a battery the Gibbs free energy is the driving force of the chemical reaction given by the Nerst equation as $$\Delta G = -nFE$$

where $\Delta G$ is the excess chemical potential, F is faraday's constant and n is the number of electrons transferred in the battery cell half-reaction. This quantity $\Delta G$ can be decomposed as in enthalpy ($\Delta H$) and entropy ($\Delta S$) as $$\Delta G = \Delta H - T\Delta S$$

where T is temperature. Applying electrical energy to the battery increases the enthalpy $\Delta H$. A higher temperature to charge the battery, consequently increases the heat generation. The efficiency $\eta$ of a battery to fast charge can be written as $$\eta = \frac{\Delta G}{\Delta H}$$

The current density i for a battery half-cell reaction according to the Tafel equation can be written as:

$$i = nFkCe^{\pm \frac{\alpha Fn}{RT}}$$

where n is the same as above, k is the rate constant of the half-cell reaction, R is the universal gas constant, F is the Faraday constant and C is the reactive species concentration on the anode or cathode surface, respectively.

In the following the reduction of the heat generation for fast charging of batteries will be described according to the invention. The heat generated in the battery is mainly due to the capacitive nature of the battery. A Norton equivalent circuit charging impedance model for a battery have an impedance that can be written as:

$$Z = R_1 + \frac{R_2}{1 + j\omega R_2 C_2}$$

where $R_1$ is the equivalent resistance of the AC/DC converter circuit, $R_2$ and $C_2$ is the associated resistance and capacitance of the battery, j is the imaginary unit and ω is the frequency of a DC output waveform to the electrical battery 320. The ability of the battery 320 to receive a charge consequently depends how the battery is being charged by the AC/DC converter circuit 100. By providing high frequency DC pulses with frequency ω to the battery, the impedance of the battery is decreased. The DC waveform may have pulses in the 1-10 ms range, preferably around 1-5 ms, to the electrical battery. Furthermore, the battery may be cooled to decrease the heat generation in the battery.

The charging speed of a battery can be determined from its C rating that describes the time for charging and discharging the battery given its internal resistance. The charging time of a 1C and 4C rated battery is 1 h and 7.5 min, respectively. According to the invention, this charging time can be reduced further by controlling the DC waveform for charging the electrical battery.

The AC voltage may be in the form of a sine wave voltage oscillating between 45 and 65 Hz. Preferably the oscillation is either substantially 50 or 60 Hz. The voltage level may oscillate around 0 V or another fixed (DC) voltage offset. The AC voltage may have a RMS value between 100 and 500 V. Preferably the AC voltage has a RMS value substantially or averaged at around 110 V, 115 V, 220 V, 230 V, 380 V, or 400 V.

The DC voltage may be a static voltage preferably in the range from 0-500 V. The DC voltage may more preferably in the range from 1-100 V. The DC may most preferably have a value substantially at or around e.g. 1.5, 3, 3.7, 4, 5, 6, 12, 24, 48 or 96 V. However, for applications significantly higher voltages may be considered such as AC voltages up to 30 kV RMS or 5 kV DC for e.g. electrified rail applications. The DC voltage should be understood as transient and may be altered through different step-down ratios to optimize the charging.

The DC voltage may be pulsed. Pulsed DC voltage (or current) may be distinguished from AC voltage (or current) by featuring very small rise and fall times. Pulsed DC signals over time may be ideally exemplified by e.g. a near discrete Heaviside step function.

The device 300 may be configured to provide DC voltage to the electrical battery 320 of an electric vehicle (EV) or a mobile electronic device. An EV may be e.g. a personal transport vehicle such as an automobile, motorbike, scooter, moped, bicycle or similar vehicles. An EV may alternatively be e.g. a commercial vehicle such as a truck, a delivery vehicle, or similar vehicles. An EV may alternatively be of e.g. industrial character such as mobile machinery, industrial equipment, a construction vehicle, a tractor or similar vehicles. The EV may alternatively be understood as alternative forms of transport such as watercraft and aircraft or rail borne vehicles, e.g. trains.

For charging of the EV the control circuit 180 may be configured to adjust an output current for constant current operation (i.e. having the current level constant and the voltage level transient) or constant voltage operation (i.e. having the voltage level constant and the current level transient). These two operation types may be utilized for dual-phase charging of the battery, further described elsewhere in this specification. The output current of the AC-DC converter circuit 100 may be configured to be in the range 300-500 A when charging the electrical battery 320 of an EV. The circuit 100 may further be configured for single-phase AC input as well as polyphase AC inputs such as two-phase (not to be confused with dual-phase) and/or three-phase AC inputs. A three-phase AC input is preferred for EV charging.

A mobile electronic device may be e.g. a mobile phone, a smartphone, a laptop computer, a tablet, a remote control, a calculator or similar devices with an electrical battery 320 and e.g. digital computing and/or data processing capacity. For charging of a mobile electronic device the control circuit 180 may be configured to adjust the output current according to specifications for USB-C Power Delivery (USB-C PD) supporting up to 100 W charging for mobile electronic device. The output current of the AC-DC converter circuit 100 may be configured to be in the range 3-10 A when charging the electrical battery 320 of a mobile electronic device. A single-phase AC input charging is preferred for mobile electronic device charging Alternatively, the AC-DC converter circuit 100 may be utilized in fixed devices or installations that such as e.g. high voltage DC (HVDC) converter or transformer stations that convert an AC voltage into a DC voltage to be transmitted through a HVDC transmission line.

Figure 7:
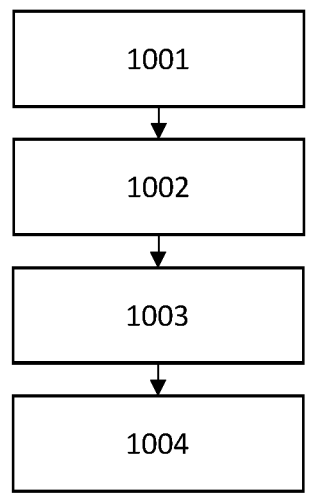
FIG. 7 shows a flow chart of method for charging an electrical battery of an electric vehicle.

FIG. 7 illustrates a method for charging an electrical battery of an electric vehicle comprising, in addition to the electrical battery, a traction motor and the AC-DC converter circuit 100. The method comprises:
  decelerating 1001 a motion of the electric vehicle;
  generating 1002 an AC type current from said traction motor by the deceleration of the motion of the electric vehicle;
  converting 1003 the generated AC type current to a DC type current by the AC-DC converter circuit 100; and
  charging 1004 the electrical battery with the DC type current.

The DC type current may be a pulsed DC type current. This may be advantageous as impedance may be reduced and charging losses may be minimized. The pulsed DC type current may preferably have pulses in the range 1-10 ms, and more preferably in the range 1-5 ms.

The method may further comprise cooling the electrical battery. Thus, heat generation in the electrical battery may be dealt with.

Figure 8:
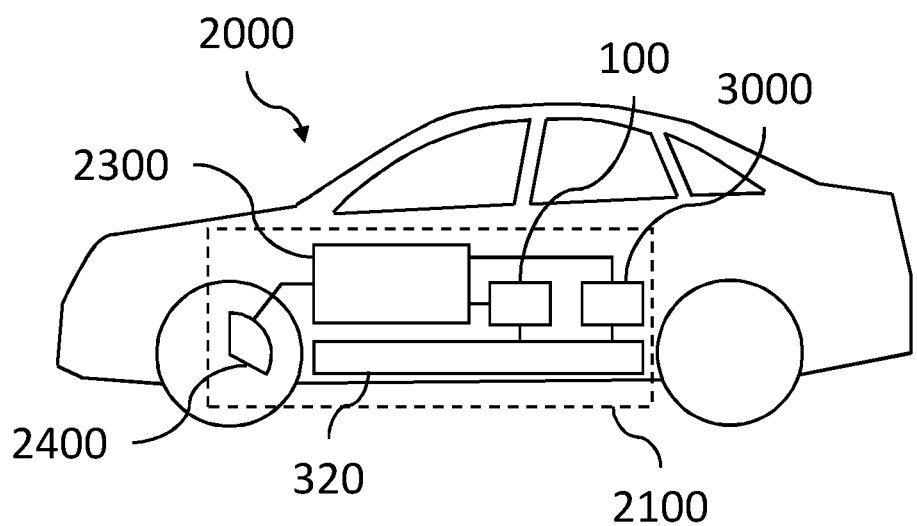
FIG. 8 shows a block schematic of a regenerative braking system of an electric vehicle.

FIG. 8 illustrates a regenerative braking system 2100 of an electric vehicle 2000, the regenerative braking system 2100 comprising:
  an electrical battery 320;
  a traction motor 2300 adapted to generate an AC type current;
  a braking system 2400 adapted for decelerating the electric vehicle 2000;
  the AC-DC converter circuit 100 configured to convert an AC type current from the traction motor 2300 to a DC type current and charge the electrical battery 320; and
  a DC-AC converter circuit 3000 configured to convert a DC type current from the electrical battery 320 to an AC type current to power the traction motor 2300.

The traction motor 2300 may be an induction-based motor comprising a rotor and a stator. The traction motor 2300 may be configured to provide torque to a wheel of the electrical vehicle 2000 in order to both accelerate and decelerate the electrical vehicle 2000. The breaking system 2400 may be integrally formed with the traction motor 2300. The breaking system 2400 may also operate by induction.

Preferred Embodiments

A preferred embodiment of the invention is an on-board charger for fast charging of an electrical battery comprising an input rectifier 110 comprising a first node 112 and a second node 114, wherein the input rectifier is configured to receive an AC voltage at the first node and provide a rectified voltage at the second node; a first transistor 120, comprising a first gate node 122, a first source node 124, and a first drain node 126, wherein the first drain node is connected to the second node of the input rectifier, and wherein the first gate node is connected to a ground node 170; a second transistor 130, comprising a second gate node 132, a second source node 134, and a second drain node 136, wherein the second drain node is connected to the first source node, wherein the second transistor materially corresponds to the first transistor; a duty cycle control unit 140 connected to the second gate node for providing the second transistor with a switching waveform; an output rectifier 150 connected to the second source node; and an output electronic filter 160 connected to the second source node. The first transistor may be a high-electron-mobility transistor, HEMT, and the second transistor may be a HEMT. The first transistor may be a gallium nitride transistor, and the second transistor may be a gallium nitride transistor. The input rectifier may be a half-wave rectifier comprising at least one diode. The input rectifier may be a full-wave rectifier comprising at least two diodes, and wherein the input rectifier further comprises a third node 116, wherein the input rectifier is configured to receive an AC voltage between the first node and the third node. It is preferred that all the diodes are GaN Schottky diodes. The AC-DC converter circuit may comprise a control circuit 180 for monitoring the output voltage level, wherein the control circuit is configured to provide feedback to the duty cycle control unit based on the monitored output voltage level. The first transistor and the second transistor may be integrated monolithically on a same substrate layer structure 290. The substrate layer structure may comprise a silicon substrate layer. The output rectifier may be a gallium nitride diode, and any diodes of the input rectifier, if present, may be gallium nitride diodes. The first transistor may comprise: a first carrier layer structure 224 above a substrate layer structure 290; a first barrier layer structure 226 above the first carrier layer structure; wherein the first gate node and the first drain node are located above the first barrier layer structure, wherein the nodes are physically separated by spacer structures 250, and wherein the second transistor comprises: a second carrier layer structure 234 above the substrate layer structure; a second barrier layer structure 236 above the second carrier layer structure;

wherein the second gate node and the second source node are located above the second barrier layer structure, wherein the nodes are physically separated by spacer structures 250, and wherein the first and second carrier layer structures comprise a first semiconductor material, and wherein the first and second barrier layer structures comprise a second semiconductor material. The first carrier layer structure may be physically separated from the second carrier layer structure by a spacer structure 250, and the first barrier layer structure may be physically separated from the second barrier layer structure by the same spacer structure 250. The first carrier layer structure may be connected to the second carrier layer structure, and the first barrier layer structure may be connected to the second barrier layer structure.

A preferred embodiment of the invention is a smartphone wall charger for fast charging of an electrical battery comprising an input rectifier 110 comprising a first node 112 and a second node 114, wherein the input rectifier is configured to receive an AC voltage at the first node and provide a rectified voltage at the second node; a first transistor 120, comprising a first gate node 122, a first source node 124, and a first drain node 126, wherein the first drain node is connected to the second node of the input rectifier, and wherein the first gate node is connected to a ground node 170;
a second transistor 130, comprising a second gate node 132, a second source node 134, and a second drain node 136, wherein the second drain node is connected to the first source node, wherein the second transistor materially corresponds to the first transistor; a duty cycle control unit 140 connected to the second gate node for providing the second transistor with a switching waveform; an output rectifier 150 connected to the second source node; and an output electronic filter 160 connected to the second source node. The first transistor may be a high-electron-mobility transistor, HEMT, and the second transistor may be a HEMT. The first transistor may be a gallium nitride transistor, and the second transistor may be a gallium nitride transistor. The input rectifier may be a half-wave rectifier comprising at least one diode. The input rectifier may be a full-wave rectifier comprising at least two diodes, and wherein the input rectifier further comprises a third node 116, wherein the input rectifier is configured to receive an AC voltage between the first node and the third node. It is preferred that the all diodes are GaN Schottky diodes. The AC-DC converter circuit may comprise a control circuit 180 for monitoring the output voltage level, wherein the control circuit is configured to provide feedback to the duty cycle control unit based on the monitored output voltage level. The first transistor and the second transistor may be integrated monolithically on a same substrate layer structure 290. The substrate layer structure may comprise a silicon substrate layer. The output rectifier may be a gallium nitride diode, and any diodes of the input rectifier, if present, may be gallium nitride diodes. The first transistor may comprise: a first carrier layer structure 224 above a substrate layer structure 290; a first barrier layer structure 226 above the first carrier layer structure; wherein the first gate node and the first drain node are located above the first barrier layer structure, wherein the nodes are physically separated by spacer structures 250, and wherein the second transistor comprises: a second carrier layer structure 234 above the substrate layer structure; a second barrier layer structure 236 above the second carrier layer structure;
wherein the second gate node and the second source node are located above the second barrier layer structure, wherein the nodes are physically separated by spacer structures 250, and wherein the first and second carrier layer structures comprise a first semiconductor material, and wherein the first and second barrier layer structures comprise a second semiconductor material. The first carrier layer structure may be physically separated from the second carrier layer structure by a spacer structure 250, and the first barrier layer structure may be physically separated from the second barrier layer structure by the same spacer structure 250. The first carrier layer structure may be connected to the second carrier layer structure, and the first barrier layer structure may be connected to the second barrier layer structure.

Another preferred embodiments of the invention is an AC-DC converter device 300 comprising the AC-DC converter circuit 100 according to any of claims 1-12, wherein the device further comprises: an interface for receiving an AC voltage 311 from an AC voltage source 310; and an interface for providing a DC voltage 312 to an electrical battery 320, wherein the electrical battery is an electrical battery of an electronic vehicle or an electrical battery of a mobile electronic device.

A preferred method according to the invention is a method for charging an electrical battery of an electric vehicle comprising, in addition to the electrical battery, a traction motor and an AC-DC converter circuit, the method comprising: decelerating 1001 a motion of the electric vehicle; generating 1002 an AC type current from said traction motor by the deceleration of the motion of the electric vehicle; converting 1003 the generated AC type current to a DC type current by the AC-DC converter circuit; and charging 1004 the electrical battery with the DC type current, wherein said DC type current further comprises a DC waveform having pulses with a 1-10 ms range, preferably wherein said pulses are 1-5 ms. The battery may also be cooled to decrease the heat generation in the battery.

Another preferred embodiment of the invention is a regenerative braking system 2100 of an electric vehicle 2000, the regenerative braking system comprising: an electrical battery 320; a traction motor 2300 adapted to generate an AC type current; a braking system 2400 adapted for decelerating the electric vehicle; an AC-DC converter circuit 100 according to claims 1-13 configured to convert an AC type current from the traction motor to a DC type current and charge the electrical battery; and a DC-AC converter circuit 3000 configured to convert a DC type current from the electrical battery to an AC type current to power the traction motor.

The disclosed embodiments and advantages are merely exemplary and are not to be construed as limiting the scope of the present disclosure. The present teachings of the AC-DC converter circuit can be readily applied to other kinds faster charging by reducing the impedance for charging. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments. As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims. Even if modifications and changes can be proposed by the skilled person it is the intention of the inventor that the scope of the invention comprises all changes and modifications that reasonably falls within the scope for the contribution to the state of the art. The features of different embodiments can be combined with other embodiments described herein mutatis mutandis. The scope of the invention is only limited by the appended claims.

The invention claimed is:

1. An AC-DC converter circuit for high power charging of an electrical battery, the AC-DC converter circuit comprising:
   an input rectifier comprising a first node and a second node, wherein the input rectifier is configured to receive an AC voltage at the first node and provide a rectified voltage at the second node;
   a first transistor, the first transistor being a depletion type transistor and comprising a first gate node, a first source node, and a first drain node, wherein the first drain node is connected to the second node of the input rectifier, and wherein the first gate node is connected to a ground node;
   a second transistor, comprising a second gate node, a second source node, and a second drain node, wherein the second drain node is connected to the first source node, wherein the second transistor materially corresponds to the first transistor;
   a duty cycle control unit connected to the second gate node for providing the second transistor with a switching waveform;
   an output rectifier;
   an output electronic filter;
   wherein the output rectifier and the output electronic filter are both connected to the second source node forming a buck topology, or the output rectifier is connected to the first source node and the output electronic filter is connected to the second source node an output node of the output rectifier forming a boost topology;
   wherein the first transistor comprises a first carrier layer structure above a substrate layer structure and a first barrier layer structure above the first carrier layer structure;
   wherein the first gate node and the first drain node are located above the first barrier layer structure, wherein the nodes are physically separated by first spacer structures;
   wherein the second transistor comprises a second carrier layer structure above the substrate layer structure and a second barrier layer structure above the second carrier layer structure;
   wherein the second gate node and the second source node are located above the second barrier layer structure, wherein the nodes are physically separated by second spacer structures;
   wherein the first and second carrier layer structures comprise a first semiconductor material;
   wherein the first and second barrier layer structures comprise a second semiconductor material; and
   wherein a third spacer structure physically separates the first carrier layer structure from the second carrier layer structure as well as physically separates the first barrier layer structure from the second barrier layer structure.

2. The AC-DC converter circuit according to claim 1, wherein the first transistor is a high-electron-mobility transistor, HEMT, and wherein the second transistor is a HEMT.

3. The AC-DC converter circuit according to claim 1, wherein the first transistor is a gallium nitride transistor, and wherein the second transistor is a gallium nitride transistor.

4. The AC-DC converter circuit according to claim 1, wherein the input rectifier is a half-wave rectifier comprising at least one diode.

5. The AC-DC converter circuit according to claim 4, wherein the input rectifier is a full-wave rectifier comprising at least two diodes, and wherein the input rectifier further comprises a third node,
   wherein the input rectifier is configured to receive an AC voltage between the first node and the third node.

6. The AC-DC converter circuit according to claim 1, further comprising a control circuit for monitoring the output voltage level, wherein the control circuit is configured to provide feedback to the duty cycle control unit based on the monitored output voltage level.

7. The AC-DC converter circuit according to claim 1, wherein the first transistor and the second transistor are integrated monolithically on a same substrate layer structure.

8. The AC-DC converter circuit according to claim 7, wherein the substrate layer structure comprises a silicon substrate layer.

9. The AC-DC converter circuit according to claim 1, wherein the output rectifier is a gallium nitride diode, and wherein any diodes of the input rectifier, if present, are gallium nitride diodes.

10. The AC-DC converter circuit according to claim 1, wherein the first carrier layer structure is connected to the second carrier layer structure, and
    wherein the first barrier layer structure is connected to the second barrier layer structure.

11. An AC-DC converter device comprising the AC-DC converter circuit according to claim 1, wherein the AC-DC device further comprises:
    an interface for receiving an AC voltage from an AC voltage source; and
    an interface for providing a DC voltage to an electrical battery, wherein the electrical battery is an electrical battery of an electronic vehicle or an electrical battery of a mobile electronic device.

12. A method for charging an electrical battery of an electric vehicle comprising, in addition to the electrical battery, a traction motor and an AC-DC converter circuit according to claim 1, the method comprising:
   decelerating a motion of the electric vehicle;
   generating an AC type current from said traction motor by the deceleration of the motion of the electric vehicle;
   converting the generated AC type current to a DC type current by the AC-DC converter circuit; and
   charging the electrical battery with the DC type current.

13. A regenerative braking system of an electric vehicle, the regenerative braking system comprising:
   an electrical battery;
   a traction motor adapted to generate an AC type current;
   a braking system adapted for decelerating the electric vehicle;
   an AC-DC converter circuit according to claim 1 configured to convert an AC type current from the traction motor to a DC type current and charge the electrical battery; and
   a DC-AC converter circuit configured to convert a DC type current from the electrical battery to an AC type current to power the traction motor.

* * * * *

UNITED STATES PATENT AND TRADEMARK OFFICE
CERTIFICATE OF CORRECTION

PATENT NO. : 12,027,989 B2
APPLICATION NO. : 17/755142
DATED : July 2, 2024
INVENTOR(S) : Martin Andreas Olsson It is certified that error appears in the above-identified patent and that said Letters Patent is hereby corrected as shown below:

On the Title Page

Page 2, Column 2 item (56) (Other Publications), Line 4, delete "Arbitrart" and insert -- Arbitrary --.

In the Specification

Column 8, Line 66, delete "of the of the" and insert -- of the --.

Column 13, Line 35, delete "DC" and insert -- DC. --.

Column 14, Line 55, delete "co" and insert -- $\omega$ --.

Column 15, Line 67, delete "charging" and insert -- charging. --.

In the Claims

Column 19, Line 66, Claim 1, delete "node an" and insert -- node and an --.

Column 20, Line 62 (approx.), Claim 11, delete "AC-DC" and insert -- AC-DC converter --.

Signed and Sealed this
Fifteenth Day of October, 2024

*Katherine Kelly Vidal*
Katherine Kelly Vidal
*Director of the United States Patent and Trademark Office*